United States Patent [19]
Kimura et al.

[11] Patent Number: 5,604,378
[45] Date of Patent: Feb. 18, 1997

[54] SEMICONDUCTOR DEVICE, ITS LEAD FRAME, AND HEAT SPREADER HAVING THROUGH HOLES

[75] Inventors: Tadashi Kimura, Hamura; Takaya Yusa, Koganei, both of Japan

[73] Assignee: Sumitomo Metal Mining Company, Limited, Tokyo, Japan

[21] Appl. No.: 224,543

[22] Filed: Apr. 7, 1994

[30] Foreign Application Priority Data

Apr. 7, 1993 [JP] Japan ................................. 5-103800

[51] Int. Cl.⁶ .......................... H01L 23/10; H01L 23/34
[52] U.S. Cl. ..................... 257/706; 257/675; 257/707; 257/796
[58] Field of Search ................................. 257/706, 707, 257/796, 675

[56] References Cited

U.S. PATENT DOCUMENTS

| | | | |
|---|---|---|---|
| 4,809,053 | 2/1989 | Kuraishi | 257/675 |
| 4,884,124 | 11/1989 | Mori et al. | 257/675 |
| 4,891,687 | 1/1990 | Mallik et al. | 257/787 |
| 5,068,708 | 11/1991 | Newman | 257/787 |
| 5,225,710 | 7/1993 | Westerkamp | 257/675 |
| 5,252,855 | 10/1993 | Ogawa et al. | 257/675 |
| 5,365,107 | 11/1994 | Kuraishi et al. | 257/673 |
| 5,397,917 | 3/1995 | Ommen et al. | 257/698 |

FOREIGN PATENT DOCUMENTS 57-045959  3/1982  Japan ..................................... 257/796

Primary Examiner—Mahshid D. Saadat
Assistant Examiner—T. M. Arroyo
Attorney, Agent, or Firm—Watson Cole Stevens Davis, P.L.L.C.

[57] ABSTRACT

In a lead frame for a semiconductor device which includes a multiplicity of leads, and a heat spreader having an edge to which the leads are bonded by an insulating material coated with an adhesive, and a central portion to which a semiconductor chip is bonded, the heat spreader has a ring-shaped portion defined between its central portion and the inner ends of the leads, and having a width of at least 0.5 mm. The ring-shaped portion has a plurality of through holes occupying not more than 60% by area of that portion, and each of those holes has a width of at least 0.5 mm.

10 Claims, 1 Drawing Sheet

SEMICONDUCTOR DEVICE, ITS LEAD FRAME, AND HEAT SPREADER HAVING THROUGH HOLES

BACKGROUND OF THE INVENTION

1. Field of the Invention

This invention relates to a resin-sealed semiconductor device and its lead frame.

2. Description of the Prior Art

A lead frame including a heat spreader is used to make a resin-sealed semiconductor device carrying a semiconductor chip which generates a relatively large amount of heat in the order of 1 to 2 W. The heat spreader has a sufficiently large area, as compared with that of the semiconductor chip, to maintain its thermal resistance at a low level. The semiconductor chip is bonded to the central portion of the heat spreader by a bondng material of good thermal conductivity, such as a low-melting brazing alloy or conductive adhesive. A multiplicity of metal leads are fastened to the outer edge of the heat spreader by an insulating material, which is usually of a polyimide resin, and an adhesive. Bonding wires, such as of gold, are connected between the chip and the inner ends of the leads. The heat spreader and the chip are enclosed in a casing molded from a resin.

A semiconductor chip of the type which generates a relatively large amount of heat has also come to be more highly integrated, and a package of the dual inline type has come to be replaced by one of the guad flat type with a large number of terminals. There already exists even a package having more than 100 terminals, or leads. The provision of a large number of leads necessitates a smaller lead width and a smaller lead pitch if the package size remains unchanged. A package having 160 leads, for example, has an inner lead pitch which is as small as about 0.23 mm.

Such a small lead pitch, however, makes it difficult for a resin, such as an epoxy resin, to flow satisfactorily through the clearance between every two adjoining leads, and makes it necessary to use a mold having two injection ports on its side facing the chip and on its side facing the head spreader, respectively. Such a mold is, however, undesirably complicated in construction, and expensive.

SUMMARY OF THE INVENTION

Under these circumstances, it is an object of this invention to provide a lead frame which can be made in a mold having a resin injection port only on one side thereof, and a semiconductor device including the same.

This object is essentially attained by a structure in which a heat spreader has a ring-shaped spacing portion defined between the edge of its chip mounting portion and the inner ends of leads, and having a width of at least 0.5 mm, the spacing portion having a plurality of through holes having a total area occupying not more than 60% of the total area of the spacing portion, each of the holes having a width of at least 0.5 mm.

The holes of the spreader form passages for a resin, and are required to have a width of at least 0.5 mm. Smaller holes make it likely that the resin may not properly flow through the holes from one mold portion on one side of the spreader to the other mold portion on the other side thereof, but may form voids, or other molding defects on the other side of the spreader. The ring-shaped spacing portion is, therefore, required to have a width of at least 0.5 mm, but its width should not exceed a range of about 2 to 3 mm, since a corresponding increase in length of bonding wires is likely to present inconveniences, such as their sagging or distortion. The holes preferably have the maximum possible width that depends on the width of the spacing portion.

Although it may appear that the provision of the holes is contrary to the purpose of the heat spreader which is intended for dissipating heat, the results of simulation have confirmed that there is only a negligible rise in thermal resistance if the holes occupy not more than 60% by area of the spacing portion. The holes may be round or rectangular. While it is possible to provide an elongated rectangular hole along each of the four sides of the spacing portion and a link at each of its four corners if it is in the form of a rectangular ring, it is preferable in view of the microscopic flow of heat to provide a plurality of holes along each side to form a plurality of links.

DESCRIPTION OF PREFERRED EMBODIMENTS

Figure 1:
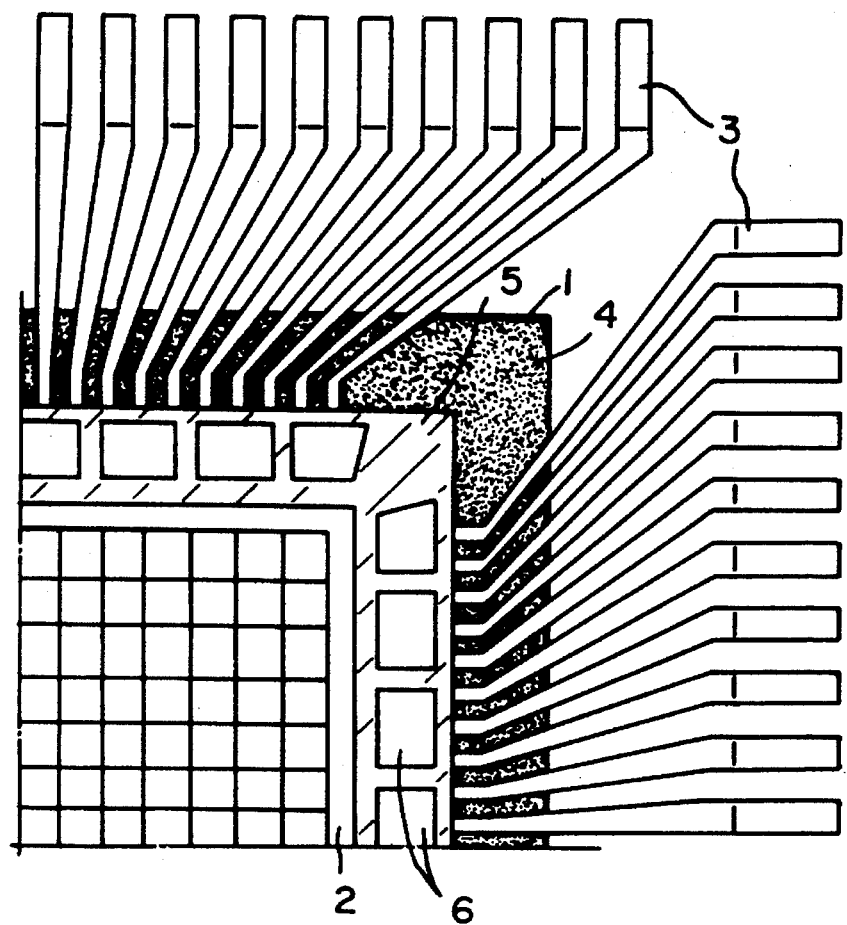
FIG. 1 is a schematic top plan view of a lead frame embodying this invetion.
Figure 2:
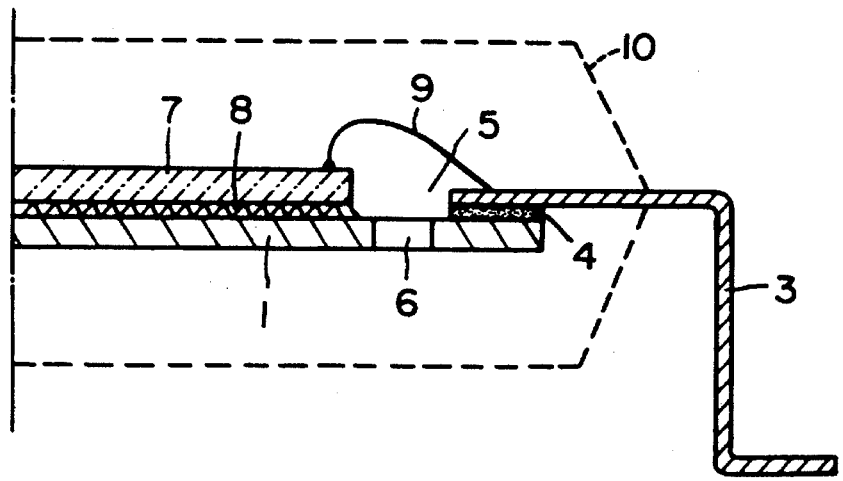
FIG. 2 is a front cross-sectional view, partly in section, of the lead frame.

A lead frame embodying this invention is shown in FIGS. 1 and 2. It includes a heat spreader 1 made of a metal or alloy, such as copper, a copper alloy, aluminum, an aluminum alloy, or an iron-nickel alloy, and having a thickness of 0.01 to 5 mm. It has a central portion defining a semiconductor chip mounting portion 2, and an edge to which a multiplicity of leads 3 are fastened by an insulating material 4 carrying an adhesive layer on each side thereof.

The leads 3 may be made of the same material with the heat spreader 1, and may be plated with, e.g., gold, silver, or tin. Each lead 3 has a thickness of 0.01 to 5 mm. The heat spreader 1 has a rectangular ring-shaped spacing portion 5 defined between the edge of its chip mounting portion 2 and the inner ends of the leads 3, and provided with through holes 6.

A semiconductor chip 7 is bonded to the central portion of the heat spreader 1 by a bonding material 8, and is connected to the inner ends of the leads 3 by bonding wires 9, as shown in FIG. 2. The lead frame is enclosed in a casing 10 molded from a resin and provides a quad flat package. The resin may be a commercially available one, such as one of the epoxy resins of Sumitomo Bakelite Company known under the tradename, EME6710 and EME6300H.

The invention will now be described in further detail with reference to a specific example. A lead frame including a total of 160 leads having a pitch of 0.23 mm at their inner ends and a pitch of 0.5 mm at their outer ends was formed by etching from a copper alloy blank having a thickness of 0.15 mm, and containing 0.30%Cr, 0.25%Sn and 0.1%Zn by weight. A 18-mm square heat spreader was formed from a blank of the same copper alloy having a thickness of 0.2 mm, and two rectangular through holes each having a width of 0.9 mm and a length of 3 mm were made in the heat spreader along each of its edge portion defining a spacing portion. The lead frame was bonded to the heat spreader by a commercially available polyimide resin film having a thickness of 0.05 mm and carrying a layer of an adhesive on each side thereof to give a lead frame including a heat spreader as shown in FIG. 1.

A 9-mm square semiconductor chip having a thickness of 0.4 mm was bonded to the heat spreader by a silver-epoxy resin adhesive, and was connected to the leads by gold wires each having a diameter of 0.025 mm. Then, a 28-mm square package having a thickness of 1.4 mm was molded about the lead frame from a resin injected into a mold through an injection port facing the semiconductor chip to yield a resin-sealed semiconductor device. The resin was a commercially available product sold by Sumitomo Bakelite Company under the tradename EME6710 for semi-conductor sealing purposes.

The X-ray examination and ultrasonic flaw detection of the device confirmed that it had no voids, but was densely filled with the resin, and that the through holes of the heat spreader were effective for filling the whole package with the resin.

As is obvious from the foregoing, this invention provides a semiconductor device which can be manufactured at a lower cost, since a package containing a lead frame with a multiplicity of leads and a heat spreader can be molded from a resin injected into a mold only on one side of the heat spreader having a plurality of through holes. The holes of the heat spreader also enable the resin to adhere more strongly to the heat spreader and form a crack-free casing.

What is claimed is:

1. A semiconductor device including a semiconductor chip, a heat spreader having a central portion to which said chip is bonded by a bonding material of good thermal conductivity, a multiplicity of leads bonded to the edge of said heat spreader by an insulating material coated with an adhesive, said leads having inner ends connected to said chip by bonding wires, and a casing molded from a resin and enclosing said chip and heat spreader, wherein said heat spreader has a ring-shaped portion defined between said central portion and said inner ends of said leads, bridged by said wires, and having a width of at least 0.5 mm, said ring-shaped portion having a plurality of through holes occupying at most 60% by area of said ring-shaped portion, each of said holes having a width of at least 0.5 mm.

2. A device as set forth in claim 1, wherein said heat spreader is made of a material selected from the group consisting of copper, a copper alloy, aluminum, an aluminum alloy, and an iron-nickel alloy.

3. A device as set forth in claim 1, ehrein said heat spreader has a thickness of 0.01 to 5 mm.

4. A device as set forth in claim 1, wherein said leads are made of a material selected from the group consisting of copper, a copper alloy, aluminum, an aluminum alloy, and an iron-nickel alloy.

5. A device as set forth in claim 4, wherein said leads are plated with a material selected from the group consisting of gold, silver and tin.

6. A device as set forth in claim 1, wherein each of said leads has a thickness of 0.01 to 5 mm.

7. A device as set forth in claim 1, wherein said resin is an epoxy resin.

8. A device as set forth in claim 1, wherein said width of said holes is from 0.5 to 3 mm.

9. A device as set forth in claim 1, wherein each of said holes has a shape selected from the group consisting of rectangular shapes and round shapes.

10. In a lead frame for a semiconductor device which includes a multiplicity of leads, and a heat spreader having an edge to which said leads are bonded by an insulating material coated with an adhesive, and a central portion to which a semiconductor chip is to be bonded, the improvement wherein said heat spreader has a ring-shaped portion defined between said central portion and said leads, and having a width of at least 1 mm, said ring-shaped portion having a plurality of through holes occupying at most 60% by area of said ring-shaped portion, each of said holes having a width of at least 0.5 mm.

* * * * *